United States Patent
Ozaki et al.

(10) Patent No.: US 9,693,456 B2
(45) Date of Patent: Jun. 27, 2017

(54) SUBSTRATE AND METAL LAYER MANUFACTURING METHOD

(71) Applicant: KABUSHIKI KAISHA TOYOTA JIDOSHOKKI, Aichi-ken (JP)

(72) Inventors: Kiminori Ozaki, Kariya (JP); Yasuhiro Koike, Kariya (JP); Hiroaki Asano, Kariya (JP); Hitoshi Shimadu, Kariya (JP); Shigeki Kawaguchi, Tokai (JP); Tomoaki Asai, Nagoya (JP)

(73) Assignee: KABUSHIKI KAISHA TOYOTA JIDOSHOKKI, Aichi-Ken (JP)

( * ) Notice: Subject to any disclaimer, the term of this patent is extended or adjusted under 35 U.S.C. 154(b) by 28 days.

(21) Appl. No.: 14/438,968

(22) PCT Filed: Oct. 23, 2013

(86) PCT No.: PCT/JP2013/078712
§ 371 (c)(1),
(2) Date: Apr. 28, 2015

(87) PCT Pub. No.: WO2014/069306
PCT Pub. Date: May 8, 2014

(65) Prior Publication Data
US 2015/0351239 A1    Dec. 3, 2015

(30) Foreign Application Priority Data
Nov. 1, 2012  (JP) .................. 2012-241897

(51) Int. Cl.
*H05K 1/11*  (2006.01)
*H05K 1/02*  (2006.01)
*H05K 3/40*  (2006.01)

(52) U.S. Cl.
CPC .......... *H05K 1/115* (2013.01); *H05K 1/0203* (2013.01); *H05K 1/0206* (2013.01);
(Continued)

(58) Field of Classification Search
CPC .... H05K 1/115; H05K 1/0203; H05K 1/0206; H05K 3/4084
(Continued)

(56) References Cited

U.S. PATENT DOCUMENTS

| | | | | |
|---|---|---|---|---|
| 4,132,856 A | * | 1/1979 | Hutchison | ............... H01L 21/56 174/16.3 |
| 2012/0119868 A1 | * | 5/2012 | Shimadu | ............. H01L 23/3677 336/200 |

FOREIGN PATENT DOCUMENTS

JP     3-117862     12/1991
JP     6-275940      9/1994
(Continued)

OTHER PUBLICATIONS

International Search Report for PCT/JP2013/078712 having a mailing date of Jan. 14, 2014.
(Continued)

*Primary Examiner* — Tuan T Dinh
*Assistant Examiner* — Mukund G Patel
(74) *Attorney, Agent, or Firm* — Greenblum & Bernstein, P.L.C.

(57) ABSTRACT

This substrate includes an insulating substrate having a first surface and a second surface, and a metal layer of a metal plate bonded to the first surface. The insulating substrate has a through hole. The metal layer includes: a bent section that is inserted through the through hole and bulges from the first surface toward the second surface; and outer periphery sections that are positioned around the bent section and are bonded to the first surface. The bent section has a first end and a second end positioned on opposite sides, and is bent with respect to the outer periphery sections at the first end and the second ends. The outer periphery sections are divided into a first outer periphery section and a second outer (Continued)

periphery section, which are respectively continuous with the first end and the second end of the bent section.

4 Claims, 3 Drawing Sheets

(52) U.S. Cl.
CPC ......... *H05K 3/4084* (2013.01); *H05K 1/0209* (2013.01); *H05K 1/112* (2013.01); *H05K 2201/066* (2013.01)

(58) Field of Classification Search
USPC ....... 361/720; 174/68.2, 252, 261, 265, 267; 29/844, 845, 854
See application file for complete search history.

(56) References Cited

FOREIGN PATENT DOCUMENTS

| | | |
|---|---|---|
| JP | 8-186339 | 7/1996 |
| JP | 2000-31606 | 1/2000 |
| JP | 2000-307202 | 11/2000 |
| WO | 2011/013673 | 2/2011 |

OTHER PUBLICATIONS

International Preliminary Report on Patentability for PCT/JP2013/078712 having a mailing date of May 5, 2015.
English-language Translation of Written Opinion of the International Searching Authority for PCT/JP2013/078712 having a mailing date of Jan. 14, 2014.

* cited by examiner

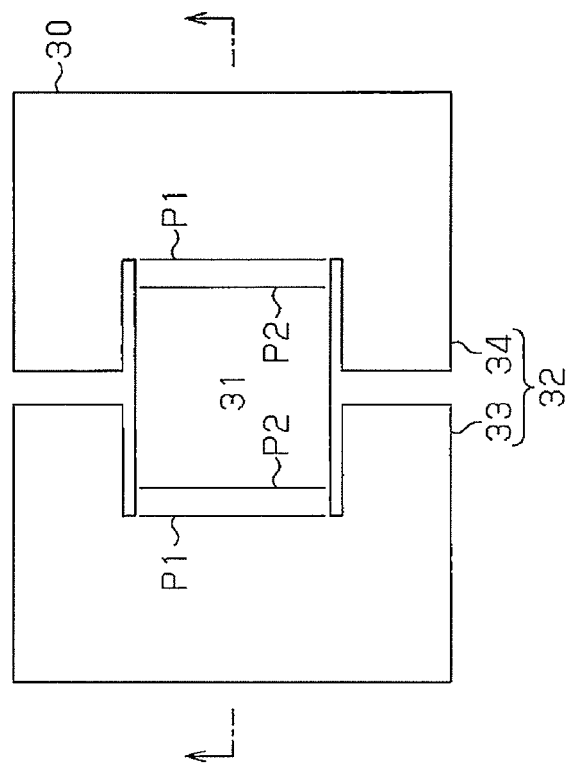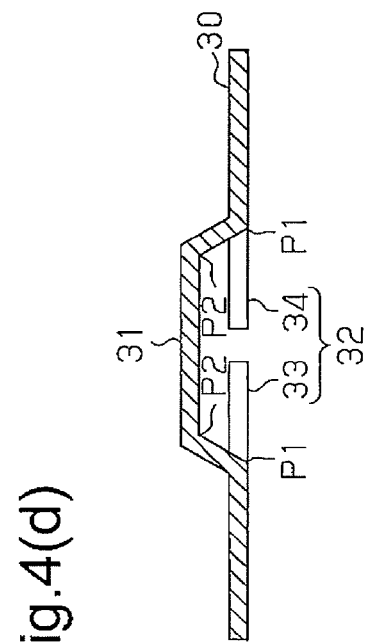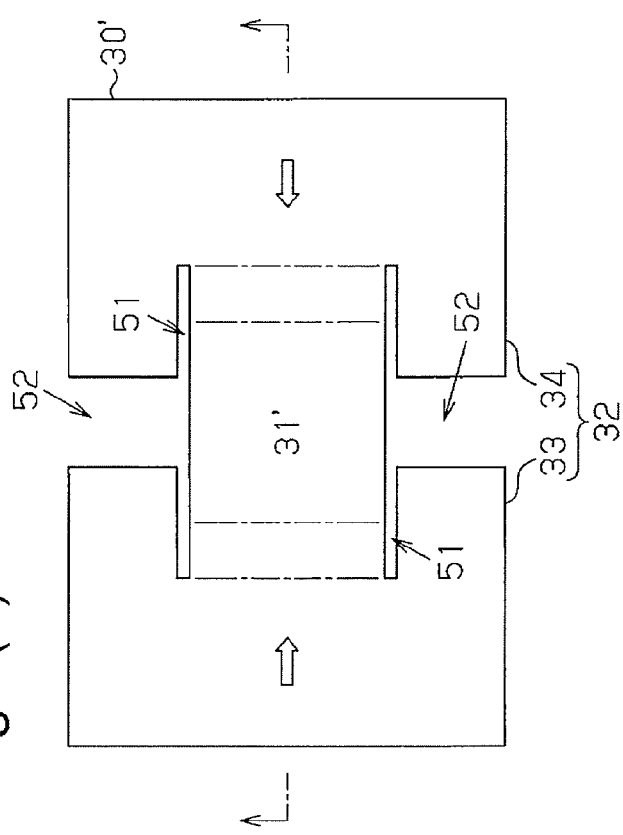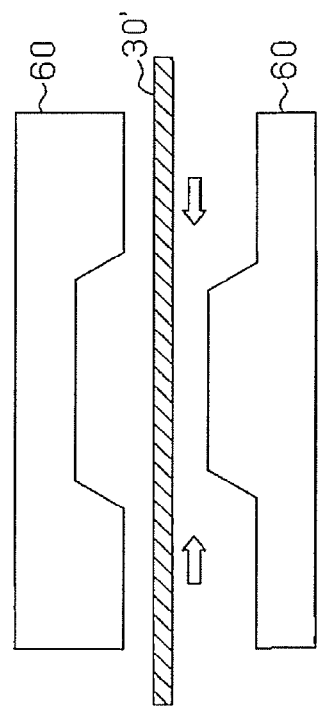

SUBSTRATE AND METAL LAYER MANUFACTURING METHOD

FIELD OF THE INVENTION

The technology of the present disclosure relates to a substrate in which a metal layer made of a metal plate adheres to an insulating substrate, and a method for manufacturing the metal layer used in the substrate.

BACKGROUND OF THE INVENTION

Patent document 1 discloses a substrate in which a metal layer adheres to a surface of an insulating substrate. The metal layer is formed by stamping a metal plate into a predetermined pattern shape. The metal layer that is made of a metal plate can be bent to change its shape. Thus, a portion of the metal layer, which is made of a metal plate, is bent to form a bent portion that is used to add a function to the metal layer. For example, in patent document 1, an end portion of the metal layer is bent to form a bent portion that protrudes from the insulating substrate. The bent portion is used as a connection terminal to an external circuit. Further, depending on the shape or the like of the insulating substrate to which the metal layer adheres, various bent portions are formed in the metal layer.

PRIOR ART DOCUMENT

Patent Document

Patent Document 1: Japanese Laid-Open Utility Model Publication No. 3-117862

SUMMARY OF THE INVENTION

The bent portion is formed by bending a metal plate, which is stamped in a predetermined pattern shape, into a predetermined three-dimensional shape by press-forming. Depending on the shape of the bent portion, creases may be formed around the bent portion. For example, when a bent portion that protrudes in the thickness direction of the metal layer is formed in the central section of the metal layer, pressing of the bent portion in the thickness direction moves the portion around the bent portion toward the bent portion. This strains the portion around the bent portion and creates creases in the metal layer. The creases formed in the metal layer create gaps between the metal layer and the insulating substrate when the metal layer adheres to the insulating substrate. This may reduce the adhesion strength of the substrate.

It is an object of the present disclosure to provide a substrate in which a metal layer, which is made of a metal plate and includes a bent portion, adheres to an insulating substrate and formation of creases in the metal layer is limited to achieve adequate adhesion between the metal layer and the insulating substrate.

BRIEF DESCRIPTION OF THE DRAWINGS

FIG. 4A is a top view showing a primary formed part.

FIG. 4B is a cross-sectional view showing the primary formed part.

FIG. 4C is a top view showing a lower metal layer.

FIG. 4D is a cross-sectional view showing the lower metal layer.

DETAILED DESCRIPTION OF THE PREFERRED EMBODIMENTS

A substrate according to one embodiment will now be described.

Figure 1:
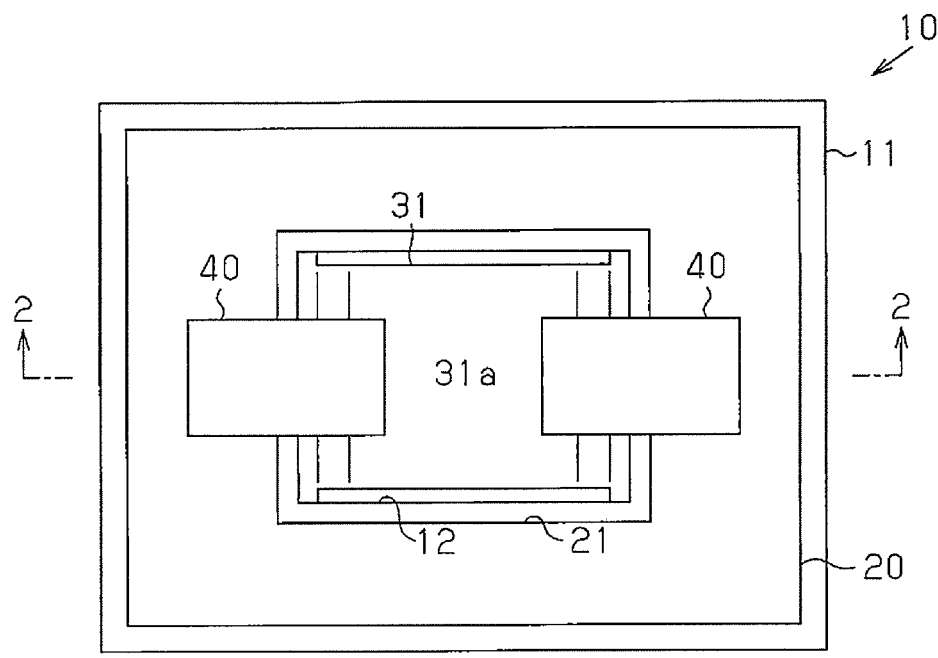
FIG. 1 is a top view showing a substrate of an embodiment.
Figure 2:
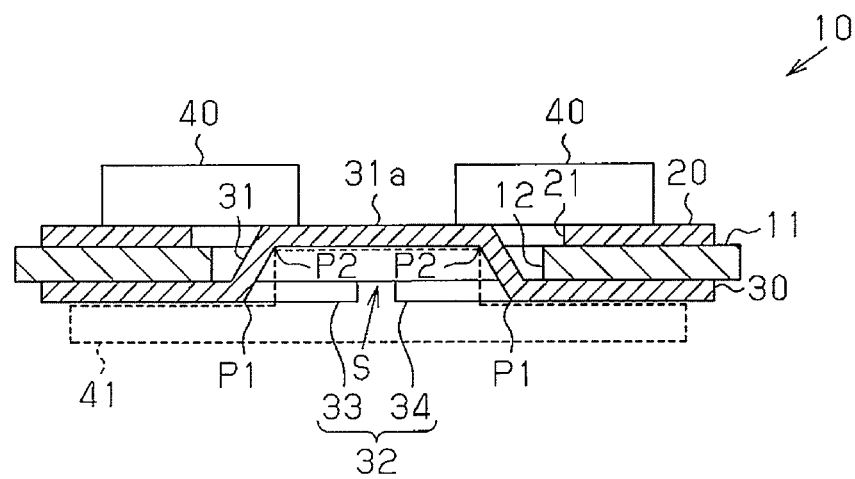
FIG. 2 is a cross-sectional view taken along line 2-2 in FIG. 1.

As shown in FIGS. 1 and 2, a substrate 10 includes an insulating substrate 11 that has a central section including a rectangular through hole 12. A flat upper metal layer 20, which has a predetermined pattern shape and is made of a metal plate, adheres to the upper surface (second surface) of the insulating substrate 11. A rectangular through hole 21, which is slightly larger than the through hole 12, is formed in the portion of the upper metal layer 20 that corresponds to the through hole 12 of the insulating substrate 11.

Figure 3:
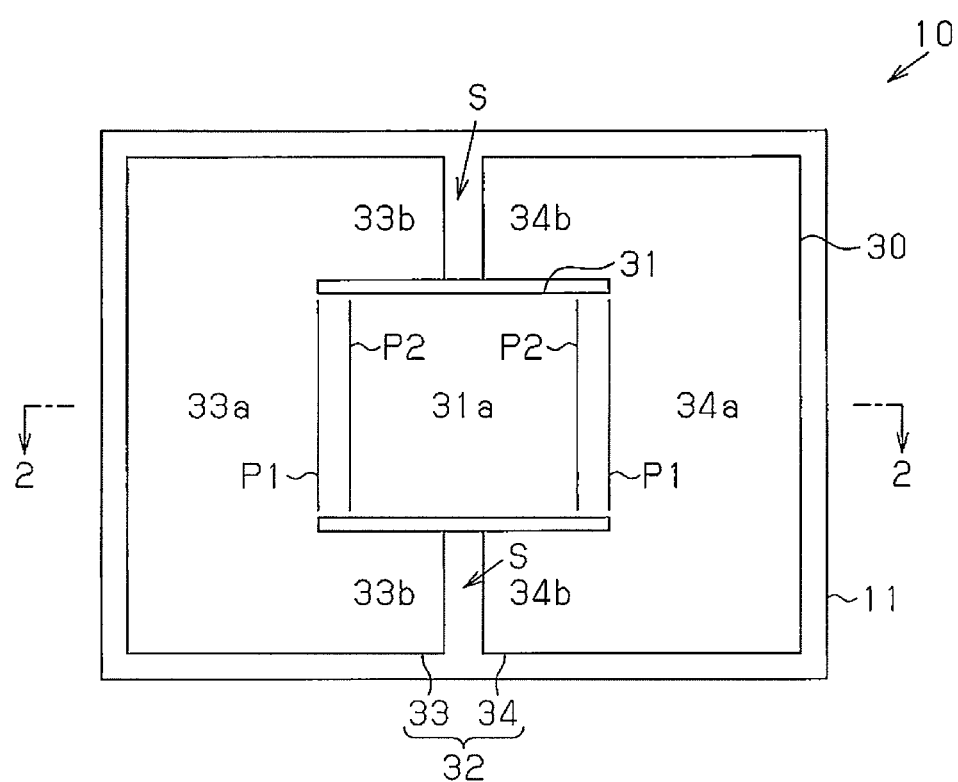
FIG. 3 is a bottom view showing a substrate of an embodiment.

As shown in FIGS. 2 and 3, a lower metal layer 30, which has a predetermined pattern shape and is made of a metal plate, adheres to the lower surface (first surface) of the insulating substrate 11. The lower metal layer 30 is made of a single metal plate and includes a bent portion 31 in its center and a periphery portion 32 that is continuous with first and second ends of the bent portion.

The bent portion 31 functions as a mount portion on which heating elements 40, which will be described below, are mounted. The bridge-shaped bent portion 31 protrudes upward and includes a flat portion 31a in its upper section. The flat portion 31a is rectangular as viewed from above. The bent portion 31 is formed by bending portions of the lower metal layer 30, more specifically, by bending upward (bending to form a valley) at primary bend lines P1 and bending downward (bending to form a ridge) at secondary bend lines P2. The primary bend lines P1 correspond to the opposite ends, which are the first and second ends, of the bent portion 31.

As shown in FIG. 2, the bent portion 31 overlaps with the through hole 12 of the insulating substrate 11 and the through hole 21 of the upper metal layer 20 as viewed in the thickness direction of the substrate 10. The bent portion 31 is inserted into the through holes 12 and 21 from the lower surface of the insulating substrate 11 so that the flat portion 31a is exposed out of the upper surface of the insulating substrate 11. The upper surface of the flat portion 31a of the bent portion 31 is flush with the upper surface of the upper metal layer 20. That is, the upper surface of the flat portion 31a is positioned at the same height as the upper surface of the upper metal layer 20 by setting the protrusion amount of the bent portion 31 to match with the sum of the thickness of the insulating substrate 11 and the thickness of the upper metal layer 20.

The periphery portion 32 functions as an adhesion portion in which the lower metal layer 30 adheres to the insulating substrate 11 and also as a heat dissipation portion that radiates and dissipates the heat transferred to the bent portion 31. As shown in FIG. 3, the periphery portion 32 is divided into a first periphery portion 33, which is continuous with the first end (P1) of the bent portion 31, and a second periphery portion 34, which is continuous with the second end (P1) of the bent portion 31. In other words, the first periphery portion 33 and the second periphery portion 34 are connected to each other only by the bent portion 31.

The first periphery portion 33 includes a side portion 33a, which is continuous with the first end of the bent portion 31 and is located on a lateral side of the bent portion 31, and extension portions 33b, which are continuous with the side portion 33a, extended on the inner side of a primary bend line P1, and located on the front and rear sides of the bent portion 31. Similarly, the second periphery portion 34 includes a side portion 34a, which is continuous with the second end of the bent portion 31 and is located on a lateral side of the bent portion 31, and extension portions 34b, which are continuous with the side portion 34a, extended on the inner side of a primary bend line P1, and located on the front and rear sides of the bent portion 31. Here, as viewed from above, the portions that sandwich the associated primary bend lines P1 with the bent portion 31 are defined to be located on the lateral sides, and the portions that are adjacent to the bent portion 31 in the direction along the primary bend lines P1 are defined to be located on the front and rear sides.

In the edges of the extension portions 33b and 34b, the portions that are adjacent to the bent portion 31 as viewed from above are aligned with the periphery of the through hole 12 of the insulating substrate 11. The distal end portions of the extension portions 33b and 34b that face each other include two sides that face each other and are separated by a gap S. The gap S separates the first periphery portion 33 from the second periphery portion 34. The entire periphery portion 32 and the upper metal layer 20 are substantially identical in outer shape.

As shown in FIGS. 1 and 2, heating elements 40 are joined to the upper surface of the upper metal layer 20 and the upper surface of the flat portion 31a in the bent portion 31 of the lower metal layer 30. Each heating element 40 extends over the upper metal layer 20 and the lower metal layer 30. As indicated by the broken line in FIG. 2, a heat dissipation member 41 is joined to the lower surface of the lower metal layer 30. The heat dissipation member 41 includes a protrusion that is joined to the lower surface of the flat portion 31a of the bent portion 31.

Referring to FIG. 4, a method for manufacturing the lower metal layer 30 will now be described.

First, a predetermined pattern shape is stamped out from a metal plate using a press to form a primary formed part 30' having the shape of a flat plate as shown in FIG. 4A. At the same time, two primary cuts 51, which extend in parallel in the longitudinal direction of the primary formed part 30', are formed in the central section of the primary formed part 30'. This forms a bend formation portion 31', which later becomes the bent portion 31, between the two primary cuts 51.

The primary formed part 30' also includes secondary cuts 52 that extend from the central section of the primary cuts 51 in the transverse direction of the primary formed part 30'. The secondary cuts 52 divide the periphery portion 32, which is located around the bend formation portion 31', into the first periphery portion 33, which is continuous with the first end of the bend formation portion 31', and the second periphery portion 34, which is continuous with the second end. The width of the secondary cuts 52 is set to be greater than the protrusion amount of the bent portion 31, that is, the sum of the thickness of the insulating substrate 11 and the thickness of the upper metal layer 20.

As shown in FIG. 4B, the primary formed part 30' is press-formed with a shaping die 60 that has an inner shape corresponding to the bent portion 31. Accordingly, the bend formation portion 31' is bent at portions indicated by the dashed dotted lines in FIG. 4A to have the shape of a bridge. The bend formation portion 31' thus becomes the bent portion 31, and the lower metal layer 30 that is shown in FIGS. 4C and 4D is formed from the primary formed part 30'.

In press-forming, the periphery portion 32 of the primary formed part 30' is subjected to force that pulls the periphery portion 32 inward along the primary cuts 51. The secondary cuts 52 divide the periphery portion 32 into the first periphery portion 33 and the second periphery portion 34. Thus, in the periphery portion 32, the pulling force just moves the first periphery portion 33 and the second periphery portion 34 toward each other and does not strain the periphery portion 32. This limits formation of creases in the periphery portion 32 of the lower metal layer 30.

The lower metal layer 30, which is manufactured as described above, is arranged on the lower surface of the insulating substrate 11 so that the bent portion 31 is inserted into the through hole 12 of the insulating substrate 11. The periphery portion 32 of the lower metal layer 30 is adhered to the lower surface of the insulating substrate 11.

Operation of the substrate 10 will now be described.

In the lower metal layer 30, the periphery portion 32, which is adhered to the insulating substrate 11, is divided into the first periphery portion 33, which is continuous with the first end of the bent portion 31, and the second periphery portion 34, which is continuous with the second end of the bent portion 31. Thus, the periphery portion 32 is not strained when the lower metal layer 30, which includes the bent portion 31, is press-formed from the primary formed part 30'. This limits formation of creases in the lower metal layer 30 and allows the upper surface of the periphery portion 32 of the lower metal layer 30 to be smooth, resulting in favorable adhesion between the insulating substrate 11 and the lower metal layer 30 in the substrate 10.

The present embodiment achieves the following advantages.

(1) The substrate 10 includes the insulating substrate 11, which has the through hole 12, and the lower metal layer 30, which adheres to the lower surface of the insulating substrate 11. The lower metal layer 30 is made of a metal plate and includes the bent portion 31, which is inserted into the through hole 12 of the insulating substrate 11 from the lower surface of the insulating substrate 11 and protrudes toward the upper surface of the insulating substrate 11, and the periphery portion 32, which is located around the bent portion 31 and adhered to the insulating substrate 11. The periphery portion 32 includes the first periphery portion 33, which is continuous with the first end of the bent portion 31, and the second periphery portion 34, which is continuous with the second end of the bent portion 31.

In the structure described above, the periphery portion 32 is divided into the first periphery portion 33 and the second periphery portion 34. Thus, the periphery portion 32 is not strained when press-forming the lower metal layer 30 from the primary formed part 30'. This limits formation of creases in the lower metal layer 30 that may be caused by strain. As a result, the upper surface of the periphery portion 32, which functions as the adhesion portion to the insulating substrate 11 can be smooth, and the adhesion between the insulating substrate 11 and the lower metal layer 30 is further improved.

(2) The first periphery portion 33 and the second periphery portion 34 include the side portions 33a and 34a that are continuous with the bent portion 31 and located on the lateral sides of the bent portion 31. Further, the first periphery portion 33 and the second periphery portion 34 include the extension portions 33b and 34b that are continuous with the side portions 33a and 34a.

The side portions 33*a* and 34*a* and the extension portions 33*b* and 34*b* improve the adhesion of the lower metal layer 30 to the insulating substrate 11 and the capability to radiate and dissipate the heat transferred to the bent portion 31. In particular, the side portions 33*a* and 34*a*, which are continuous with the bent portion 31, significantly improves the heat dissipation capability, which can be further increased by enlarging the side portions 33*a* and 34*a*.

Further, the extension portions 33*b* and 34*b* significantly improve the adhesion of the lower metal layer 30 to the insulating substrate 11. The side portions 33*a* and 34*a* may need to be reduced in size depending on the relationship with other members arranged in the substrate 10. In such a case, the bending at the primary bend lines P1 has a greater effect on the entire side portions 33*a* and 34*a*, and it would be difficult for the side portions 33*a* and 34*a* to have an adequate flatness. On the other hand, the extension portions 33*b* and 34*b*, which are separated from the bent portion 31, is less affected by the bending, and thus the flatness of the extension portions 33*b* and 34*b* can be easily increased. Accordingly, even when the flatness of the side portions 33*a* and 34*a* is difficult to increase, the adhesion of the lower metal layer 30 to the insulating substrate 11 can be improved by adding the extension portions 33*b* and 34*b* having a high flatness.

(3) Portions of the edges of the extension portions 33*b* and 34*b* are aligned with the periphery of the through hole 12 of the insulating substrate 11. The extension portions 33*b* and 34*b* are sized so that the edges of the extension portions 33*b* and 34*b* are aligned with the periphery of the through hole 12. This further improves the adhesion and heat dissipation of the extension portions 33*b* and 34*b*.

(4) The outer shape of the entire periphery portion 32 of the lower metal layer 30 is substantially identical to the outer shape of the upper metal layer 20. More specifically, the side portions 33*a* and 34*a* and the extension portions 33*b* and 34*b* are formed in conformance with the outer shape of the upper metal layer 20. When the upper metal layer 20 and the lower metal layer 30 adhere to the insulating substrate 11, such a structure evenly disperses the pressure applied to the metal layers. This further improves the adhesion of the upper metal layer 20 and the lower metal layer 30 to the insulating substrate 11.

(5) Each heating element 40 is joined to the upper surface of the flat portion 31*a* in the bent portion 31 of the lower metal layer 30, and the heat dissipation member 41 is joined to the lower surface of the flat portion 31*a*. The heat dissipation member 41 is joined to the lower metal layer 30, to which the heating element 40 is joined, without another member located between the lower metal layer 30 and the heat dissipation member 41. This allows the heat dissipation member 41 to effectively cool the heating element 40 and the lower metal layer 30.

The above described embodiment may be modified as follows.

The substrate 10 may be inverted. That is, the substrate 10 of the above embodiment may be turned upside down so that the upper metal layer 20 functions as the lower metal layer and the lower metal layer 30 functions as the upper metal layer.

The substrate 10 is not limited to a double-sided substrate and may be a multi-layered substrate further including an inner layer having a predetermined pattern.

The metal plates that form the upper metal layer 20 and the lower metal layer 30 may be formed from a conductive metal material, such as copper or aluminum. The thickness of the metal plate is preferably 0.4 to 2.0 mm, more preferably 0.5 to 1.0 mm.

There is no limitation to the structure of the first periphery portion 33 and the second periphery portion 34 of the lower metal layer 30. For example, the side portions 33*a* and 34*a* may be larger than the extension portions 33*b* and 34*b*, or the extension portions 33*b* and 34*b* may be larger than the side portions 33*a* and 34*a*. Further, at least one of the extension portions 33*b* and 34*b* may be omitted.

The extension portions 33*b* of the first periphery portion 33 may be in contact with the extension portions 34*b* of the second periphery portion 34. For example, in the above embodiment, if the width of the secondary cuts 52, which are formed in the primary formed part 30', is set to be equal to the protrusion amount of the bent portion 31, the distal ends of the extension portions 33*b* and 34*b* of the lower metal layer 30 that face each other are in contact without pressing each other.

The heating element 40 may be replaced by another electronic component that is typically mounted on a substrate.

The heating element 40 and the heat dissipation member 41 may be omitted if appropriate.

Each primary cut 51 formed in the primary formed part 30' may be a linear cut that does not have a width.

What is claimed is:
1. A substrate comprising:
an insulating substrate including a first surface and a second surface; and
a metal layer that is adhered to the first surface and made of a metal plate, wherein
the insulating substrate includes a through hole,
the metal layer includes a bent portion, which is inserted into the through hole and protrudes in a direction extending from the first surface to the second surface, and a periphery portion, which is located around the bent portion and adhered to the first surface,
the bent portion includes a first end and a second end that are located on opposite sides, the bent portion is bent from the periphery portion at the first end and the second end,
the periphery portion is divided into a first periphery portion, which is continuous with the first end of the bent portion, and a second periphery portion, which is continuous with the second end of the bent portion
the first periphery portion includes a first side portion that is continuous with the first end of the bent portion,
the second periphery portion includes a second side portion that is continuous with the second end of the bent portion,
the first and second side portions are located on opposite sides of the bent portion,
the first periphery portion and the second periphery portion each include an extension portion that extends continuously from a corresponding one of the side portions, and the extension portions extend toward each other,
the metal layer further includes a cut arranged between the bent portion and the extension portion, and
a gap that separates the first periphery portion from the second periphery portion is formed between a distal end portion of the extension portion in the first periphery portion and a distal end portion of the extension portion in the second periphery portion.

2. The substrate according to claim 1, wherein a portion of an edge of the periphery portion is aligned with a periphery of the through hole of the insulating substrate.

3. The substrate according to claim 1, further comprising an additional metal layer adhered to the second surface of the insulating substrate.

4. The substrate according to claim 1, wherein
a heating element is joined to a surface of the bent portion that faces the same direction as the second surface, and
a heat dissipation member is joined to a surface of the bent portion that face the same direction as the first surface.

* * * * *